(12) United States Patent
Mathieu et al.

(10) Patent No.: US 7,488,917 B2
(45) Date of Patent: *Feb. 10, 2009

(54) ELECTRIC DISCHARGE MACHINING OF A PROBE ARRAY

(75) Inventors: Gaetan L. Mathieu, Varennes (CA); Benjamin N. Eldridge, Danville, CA (US); Gary W. Grube, Pleasanton, CA (US)

(73) Assignee: FormFactor, Inc., Livermore, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/550,340

(22) Filed: Oct. 17, 2006

(65) Prior Publication Data
US 2007/0062913 A1    Mar. 22, 2007

Related U.S. Application Data

(63) Continuation of application No. 10/302,969, filed on Nov. 25, 2002, now Pat. No. 7,122,760.

(51) Int. Cl.
*B23H 9/00* (2006.01)
(52) U.S. Cl. .................................. 219/69.17
(58) Field of Classification Search .............. 219/69.17; 324/754, 758, 761, 762
See application file for complete search history.

(56) References Cited

U.S. PATENT DOCUMENTS

| | | | |
|---|---|---|---|
| 3,564,190 A * | 2/1971 | Kandajan et al. ........... 219/69.2 |
| 3,654,585 A | 4/1972 | Wickersham | |
| 4,387,287 A * | 6/1983 | Marazzi ................... 219/69.17 |
| 4,418,857 A | 12/1983 | Ainslie et al. | |
| 4,524,259 A * | 6/1985 | Wolf et al. .............. 219/69.15 |
| 4,622,514 A | 11/1986 | Lewis | |
| 4,901,013 A * | 2/1990 | Benedetto et al. ........... 324/761 |
| 5,124,646 A | 6/1992 | Shiraishi | |
| 5,148,103 A | 9/1992 | Pasiecznik, Jr. | |

(Continued)

FOREIGN PATENT DOCUMENTS

CH     661129 A5     10/1983

(Continued)

OTHER PUBLICATIONS

Takahata et al., "A Novel Micro Electro-Discharge Machining Method Using Electrodes Fabricated by the LIGA Process", Micro Electro Mechanical Systems, 1999, MEMS '99 Twelfth IEEE International Conference in Orlando, Fl., USA, pp. 238-243, Jan. 17-21, 1999.

*Primary Examiner*—Geoffrey S Evans
(74) *Attorney, Agent, or Firm*—N. Kenneth Burraston

(57) ABSTRACT

A method of forming a probe away includes forming a layer of tip material over a block of probe material. A first electric discharge machine (EDM) electrode is positioned over the layer of tip material, the EDM electrode having a plurality of openings corresponding to a plurality of probes to be formed. Excess material from the layer of tip material and the block of probe material is removed to form the plurality of probes. A substrate having a plurality of through holes corresponding to the plurality of probes is positioned so that the probes penetrate the plurality of through holes. The substrate is bonded to the plurality of probes. Excess probe material is removed so as to planarize the substrate.

13 Claims, 10 Drawing Sheets

U.S. PATENT DOCUMENTS

| | | | |
|---|---|---|---|
| 5,195,237 A | 3/1993 | Cray et al. |
| 5,221,895 A | 6/1993 | Janko et al. |
| 5,225,777 A | 7/1993 | Bross et al. |
| 5,286,944 A | 2/1994 | Li |
| 5,308,443 A | 5/1994 | Sugihara |
| 5,354,712 A | 10/1994 | Ho et al. |
| 5,366,380 A | 11/1994 | Reymond |
| 5,367,254 A | 11/1994 | Faure et al. |
| 5,399,982 A | 3/1995 | Driller et al. |
| 5,476,818 A | 12/1995 | Yanof et al. |
| 5,513,430 A | 5/1996 | Yanof et al. |
| 5,534,787 A | 7/1996 | Levey |
| 5,555,422 A | 9/1996 | Nakano |
| 5,573,435 A | 11/1996 | Grabbe et al. |
| 5,600,257 A | 2/1997 | Leas et al. |
| 5,629,631 A | 5/1997 | Perry et al. |
| 5,686,842 A | 11/1997 | Lee |
| 5,821,763 A | 10/1998 | Beaman et al. |
| 5,828,226 A | 10/1998 | Higgins et al. |
| 6,014,032 A | 1/2000 | Maddix et al. |
| 6,016,061 A | 1/2000 | Miauta |
| 6,029,344 A | 2/2000 | Khandros et al. |
| 6,031,282 A | 2/2000 | Jones et al. |
| 6,051,982 A | 4/2000 | Alcoe et al. |
| 6,059,982 A | 5/2000 | Palagonia et al. |
| 6,072,190 A | 6/2000 | Watanabe et al. |
| 6,087,840 A | 7/2000 | Mizuta |
| 6,144,212 A | 11/2000 | Mizuta |
| 6,150,830 A | 11/2000 | Schmid et al. |
| 6,160,412 A | 12/2000 | Martel et al. |
| 6,184,576 B1 | 2/2001 | Jones et al. |
| 6,194,904 B1 | 2/2001 | Clayton et al. |
| 6,289,583 B1 | 9/2001 | Belmont et al. |
| 6,307,692 B1 | 10/2001 | Brown et al. |
| 6,336,269 B1 | 1/2002 | Eldridge et al. |
| 7,122,760 B2 | 10/2006 | Mathieu et al. |
| 2001/0052180 A1 | 12/2001 | Clayton et al. |

FOREIGN PATENT DOCUMENTS

| | | |
|---|---|---|
| DE | 3129568 A1 | 4/1982 |
| EP | 463684 B1 | 4/1996 |
| JP | 61-19700 | 2/1986 |
| JP | 61-125737 A * | 6/1986 |
| JP | 62-197073 | 12/1987 |
| JP | 4-171125 A * | 6/1992 |
| JP | 05-218156 | 8/1993 |
| JP | 06-50990 | 2/1994 |
| JP | 07-21968 | 1/1995 |
| JP | 07-333232 | 12/1995 |
| TW | 334607 | 6/1998 |
| WO | WO 96/15458 | 5/1996 |

* cited by examiner

FIG. 3
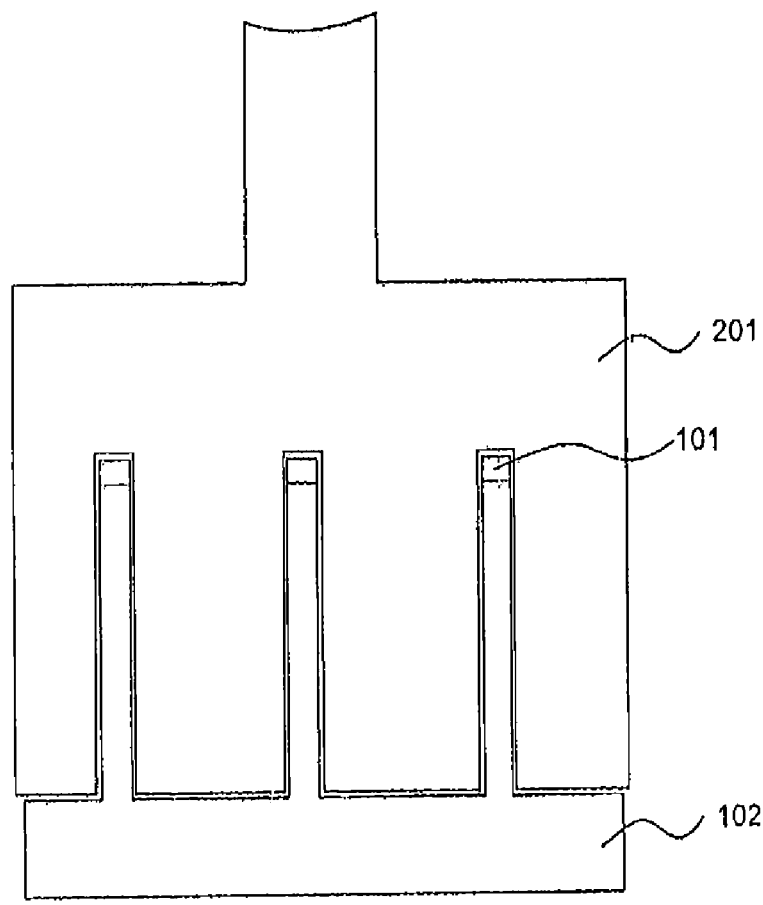
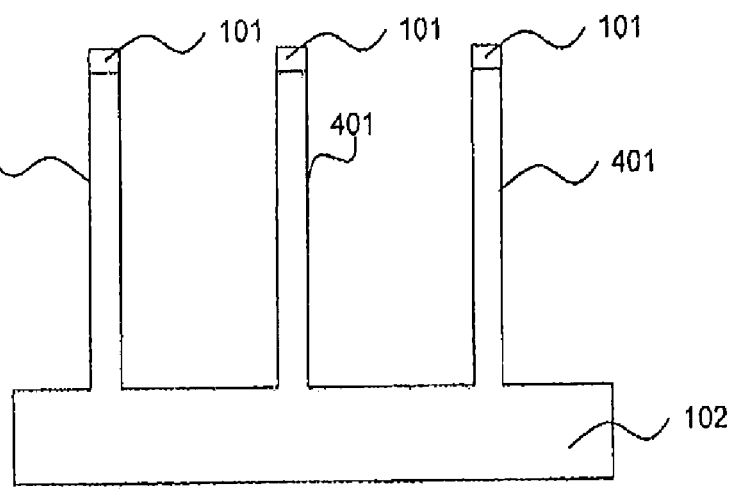
FIG. 4

ELECTRIC DISCHARGE MACHINING OF A PROBE ARRAY

This application is a continuation of U.S. application Ser. No. 10/302,969, filed Nov. 25,2002, now U.S. Pat. No. 7,122,760.

BACKGROUND OF THE INVENTION

1. Field of the Invention

The present invention is related to a method of making an array of probes for use in probing electronic devices, such as a probe card for probing the dies on a semiconductor wafer.

2. Related Art

Semiconductor dies must be tested during the manufacturing process to insure the reliability and performance characteristics of integrated circuits on the dies. Accordingly, different testing procedures have been developed by semiconductor manufacturers for testing semiconductor dies. Standard tests for gross functionality are typically performed by probe testing the dies at the wafer level. Probe testing at the wafer level can also be used to rate the speed grades of the dies.

Testing a large number of integrated circuit chips in parallel at the wafer level provides significant advantage since test time and cost are substantially reduced. At present, large scale testers including mainframe computers are needed to test even one chip at a time, and the complexity of these machines is increased when the capability of testing arrays of chips in parallel is added. Nevertheless, because of the time savings parallel testing provides, high pin-count testers capable of probing and collecting data from many chips simultaneously have been introduced, and the number of chips that can be tested simultaneously has been gradually increasing.

Substantial lower cost would result from an improved wafer test and burn-in scheme that permits parallel test and burn-in of the chips on a wafer before dicing.

As wafer testing requirements become more sophisticated, the need for high density probes, and efficient and relatively inexpensive methods of manufacturing them continues to be a challenge. Accordingly, a need exists for an inexpensive and efficient method of manufacturing high density probe array.

SUMMARY OF THE INVENTION

The present invention is directed to a probe array for testing of semiconductor wafers and a method of its manufacture that substantially obviates one or more of the problems and disadvantages of the related art.

There is provided a method of manufacturing a probe array including forming a first substrate having a plurality of through holes. A second substrate is formed having a plurality of probe tips embedded therein. A plurality of wires are bonded to corresponding probe tips of the second substrate. The through holes of the first substrate are mated with the plurality of wires. The second substrate is removed. The first substrate is planarized, and connections are formed on the first substrate to the plurality of wires for connecting to external signal sources.

In another aspect there is provided a method of forming a probe array including forming a layer of tip material over a block of probe material. A first electric discharge machine (EDM) electrode is positioned over the layer of tip material, the EDM electrode having a plurality of openings corresponding to a plurality of probes to be formed. Excess material from the layer of tip material and the block of probe material is removed to form the plurality of probes. A substrate having a plurality of through holes corresponding to the plurality of probes is positioned so that the probes penetrate the plurality of through holes. The substrate is bonded to the plurality of probes. Excess probe material is removed so as to planarize the substrate. Advantages of the method of making the probe array according to the present invention include the use of two stages of steps with two different substrates. Therefore, the processing steps of the two stages can be carried out in parallel and independent of one another. Any errors or defects that may be present require only a repetition of one set of steps. Also, the resultant probe array has through holes that provide support along at least a segment of the probe. The support is especially advantageous in a probe array with lateral contact movement or wiping.

In another aspect there is provide a probe array including a substrate, and a plurality of probes for contacting test terminals on a test device. Each probe has a stem and a tip. Each probe penetrates the substrate for support. The substrate has a plurality of through holes such that the stems of the probes penetrate the through holes and are bonded to the substrate.

Additional features and advantages of the invention will be set forth in the description that follows, and in part will be apparent from the description, or may be learned by practice of the invention. The advantages of the invention will be realized and attained by the structure and particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to illustrate exemplary embodiments of the invention and are incorporated in and constitute a part of this specification, illustrate embodiments of the invention and together with the description serve to explain the principles of the invention. In the drawings:

FIGS. 1-4 illustrate the steps in one method of manufacturing probes for a vertical probe array.

DETAILED DESCRIPTION OF EMBODIMENTS OF THE INVENTION

Reference will now be made in detail to the embodiments of the present invention, examples of which are illustrated in the accompanying drawings.

Figure 7:
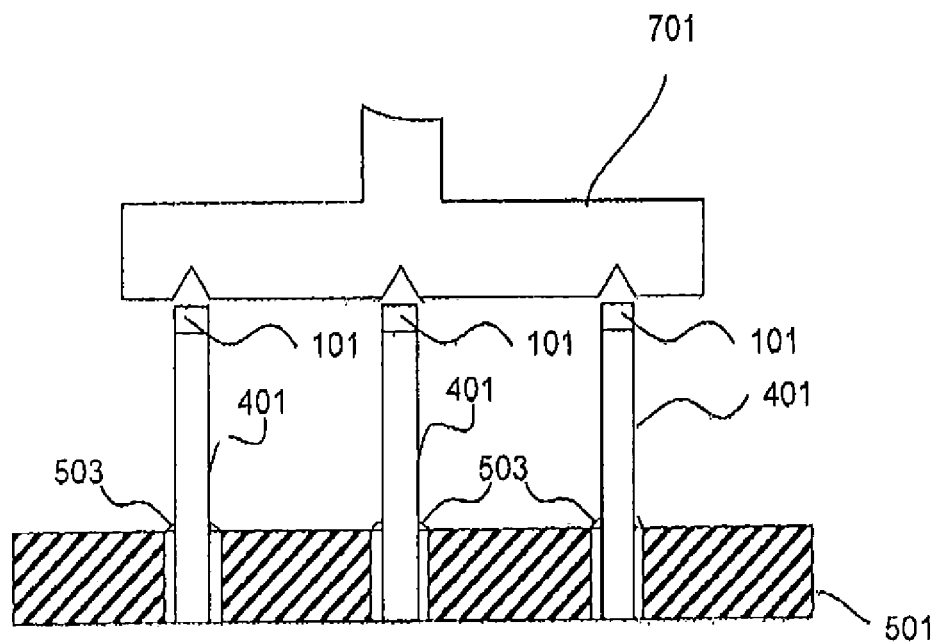
FIGS. 7-8 illustrate the Steps of shaping tips of the probes of the probe array of FIG. 6.
Figure 8:
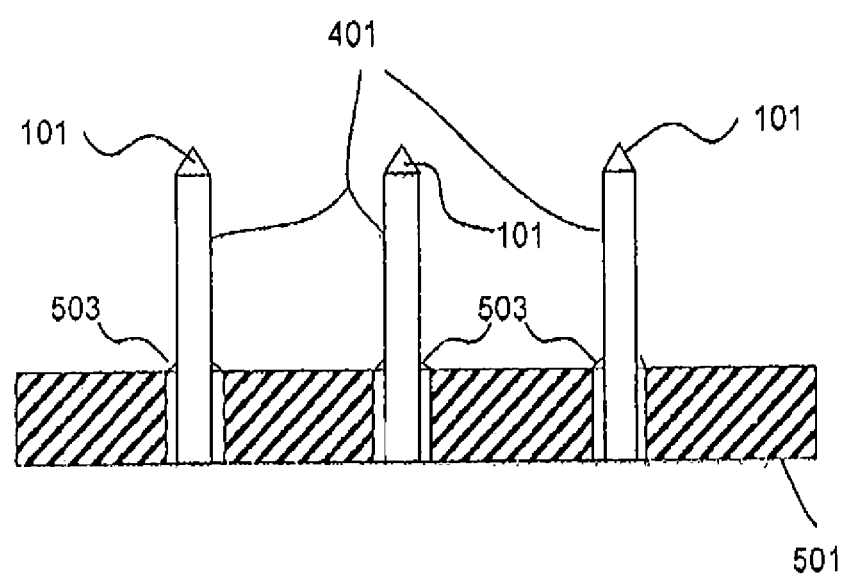
Figure 9:
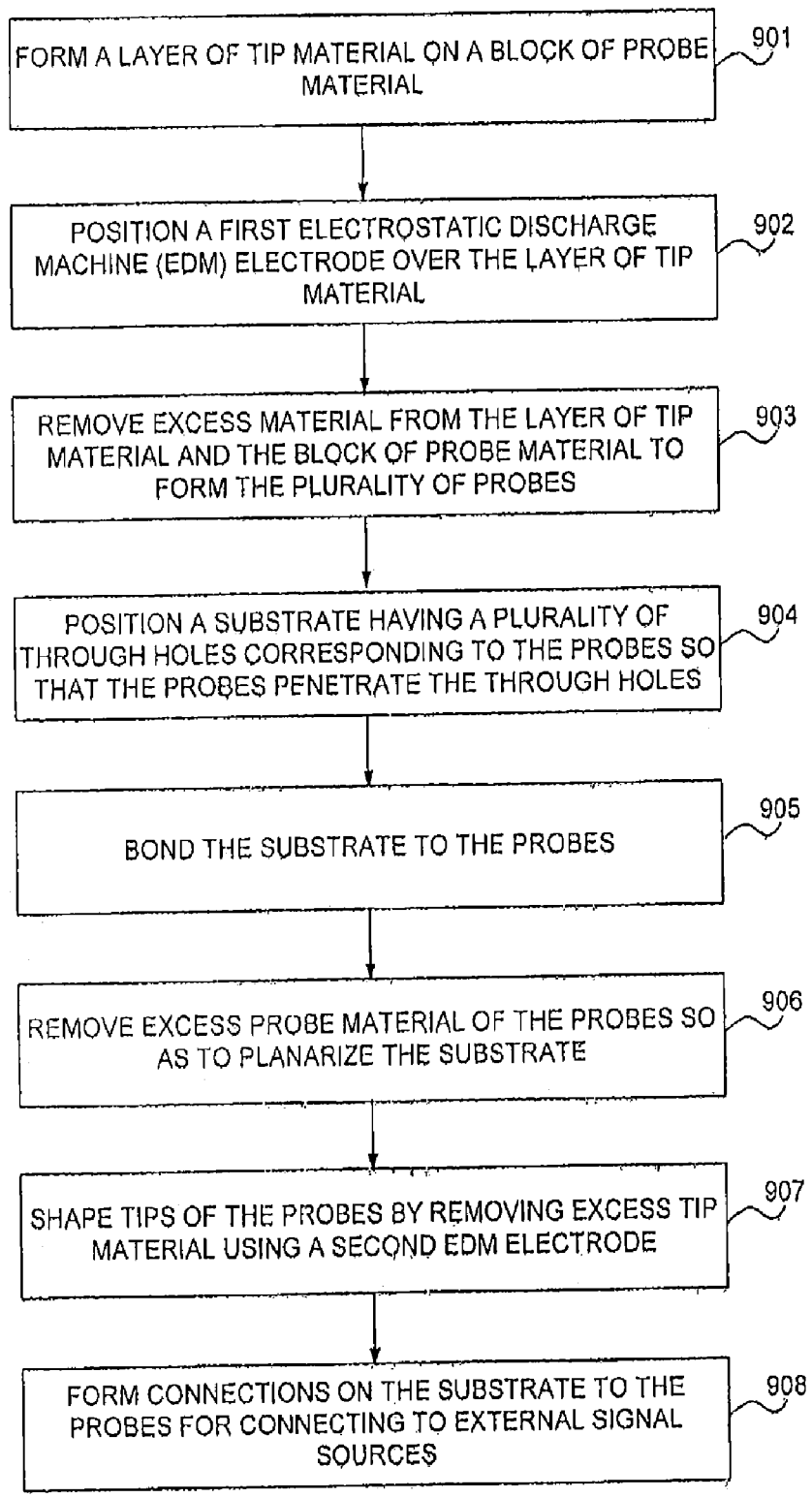
FIG. 9 illustrates in flow chart form the steps involved in manufacturing the probe array corresponding to FIGS. 1-8.

FIGS. 1-8 illustrate a first method of forming an array of probes, and FIG. 9 shows the steps 901-908 for making the probes as shown in FIGS. 1-8 in flow chart form.

Figure 1:
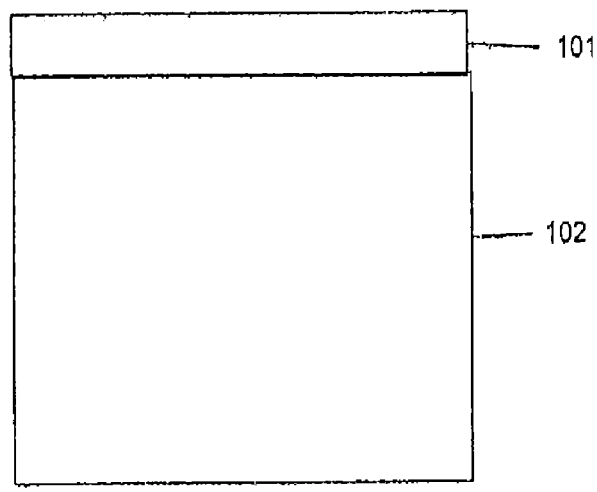

As shown in FIG. 1, a block of tip material 101 is attached to a block of probe material 102 (step 901). The tip material 101 and the probe material 102 should be conductive, but otherwise may be formed of any number of known materials. Examples of suitable tip materials and probe materials include palladium, copper, gold, rhodium, nickel, cobalt, silver, platinum, conductive nitrides, conductive carbides, tungsten, titanium, molybdenum, rhenium, indium, osmium, refractory metals, and alloys or composite compositions including one or more of any of the foregoing. The tip material 101, for example, may be electroplated onto the probe material 102. The tip material 101 may also be welded, soldered, brazed, etc. to the probe material 102. Of course, the probe material 102 and/or the tip material 101 may be further treated. For example, one or both of the materials may be heat treated or annealed; ions may be implanted into either or both materials; etc. Moreover, such further treatment may be performed at any time during the process, including before the EDM electrodes shape the material and after the materials are fully shaped by the EDM electrodes. In addition, at any time during shaping by an EDM electrode, the shaping process may be stopped, and a material treated.

Figure 2:
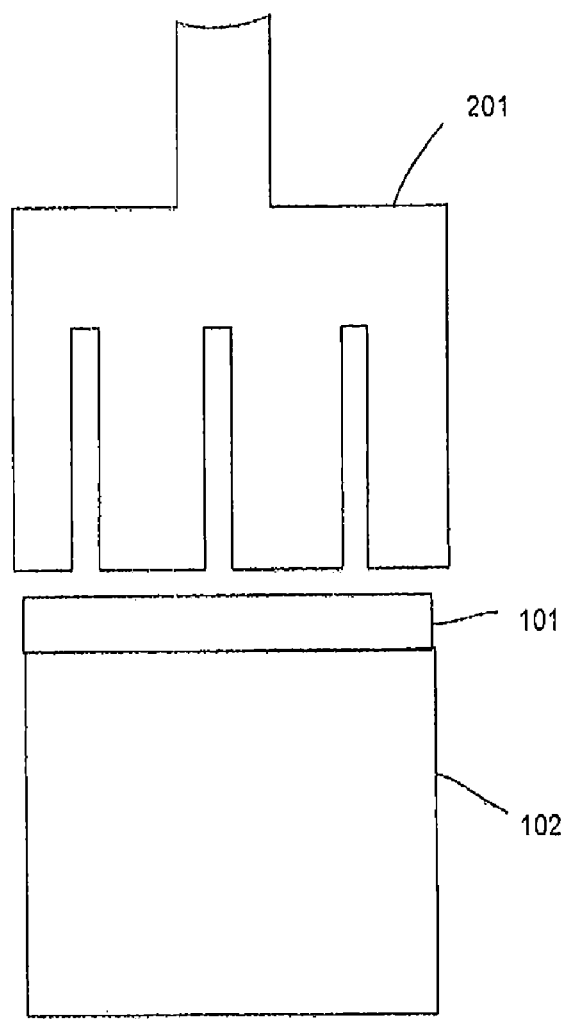
Figure 5:
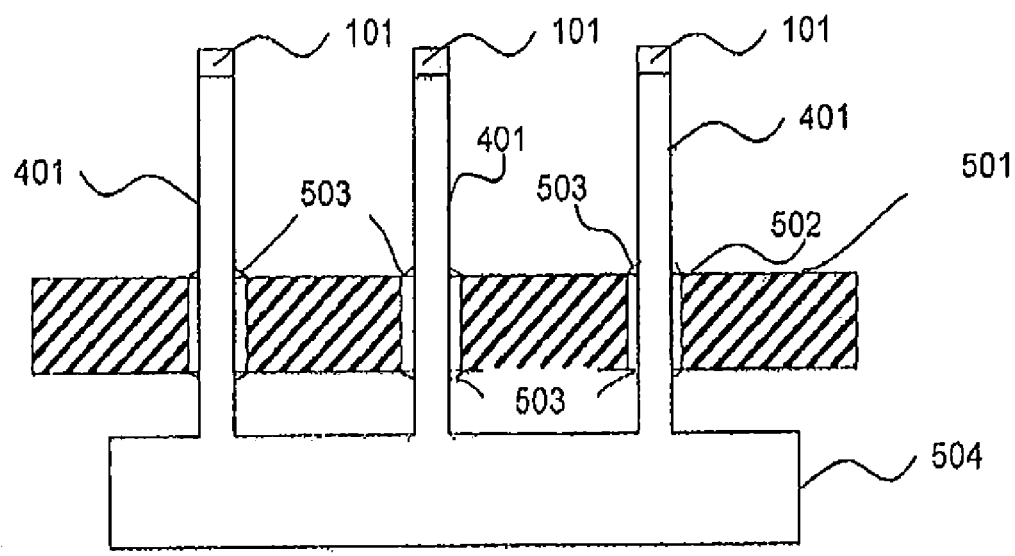
FIGS. 5-6 illustrate the steps of joining the probes illustrated in FIGS. 1-4 with a substrate to form a probe array.
Figure 6:
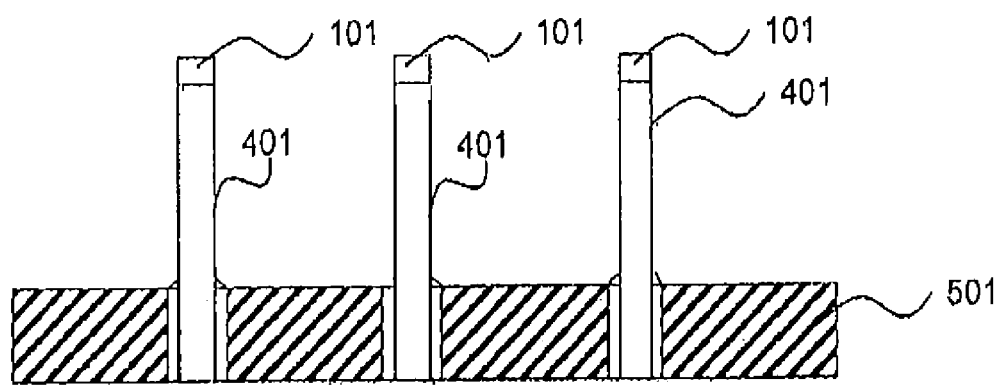

An electric discharge machine ("EDM") is then used to shape the tip material 101 and probe material 102 into basic probe shapes (steps 902-903). A first EDM electrode 201 shaped in the form of the desired probe away is applied to the block of tip material 101 and probe material 102 as shown in FIGS. 2 and 3. After excess material is removed, the resulting structure is shown in FIG. 4. Probes 401 are then secured in the through holes 502 of a substrate 501 (which may be made of, for example, ceramic, silicon, printed circuit board material, etc.), as shown in FIG. 5, using solder 503 or some other suitable joining material (steps 904-905). Press-fit and thermal-fit techniques may also be used. The bottom portion 504 (relative to the orientation shown in FIG. 5) of the probe material 102 is then removed, as shown FIG. 6 (step 906). In one example, excess probe material 102 of bottom portion 504 is removed so as to planarize the substrate. Etching, grinding, polishing, lapping, or other suitable methods may be used to remove the bottom portion 504. Alternatively, portions of the probes 410 may be left extending through the bottom (as oriented in FIG. 5) of substrate 501. For example, only the bottom portion 504 may be removed (e.g., using an EDM electrode, etching, etc.). The portions of probes 410 that extend through the bottom of substrate 501 may be secured (e.g., by soldering) to another substrate.

As shown in FIG. 7, a second EDM electrode 701 is used to shape the tip material 101 on the ends of the probes 401 by removing excess material (step 907), to result in the structure of FIG. 8. Electrical connections (not shown) are then formed on the first substrate 501 to the probes 401 for use in connecting to external test signal sources (step 908). The structure shown in FIG. 8 may be used to make a probe card assembly or other apparatus for probing electronic devices. Of course, the tip material 101 may be shaped as in FIGS. 7 and 8 before securing the probes 401 to the substrate 501.

The EDM electrodes 201 may be formed of any conductive material that can be etched, machined, or otherwise processed to form the desired patterns. For example, the first EDM electrode 201 may be formed of graphite, which can be patterned using laser ablation (e.g., using an excimer laser). As another example, the second EDM electrode 701 may be formed of silicon, which may be highly doped and which can be patterned by etching pits into the surface of the silicon. Optionally, a surface of the EDM electrode may be metallized by sputtering, plating, chemical vapor deposition, and other techniques, or otherwise treated.

Thus, there is provided a method of forming a probe away including forming a layer of tip material 101 over a block of probe material 102. A first electric discharge machine (EDM) electrode 201 is positioned over the layer of tip material 101, the EDM electrode 201 having a plurality of openings corresponding to a plurality of probes 401 to be formed. Excess material from the layer of tip material 101 and the block of probe material 102 is removed to form the plurality of probes 401. A substrate 501 having a plurality of through holes 502 corresponding to the plurality of probes 401 is positioned so that the probes 401 penetrate the plurality of through holes 502. The substrate 501 is bonded to the plurality of probes 401. Excess probe material is removed so as to planarize the substrate 501. The tip material may be further treated before or after forming the probes. For example, the tip material may be treated using ion implantation techniques, plating, etc.

Figure 10:
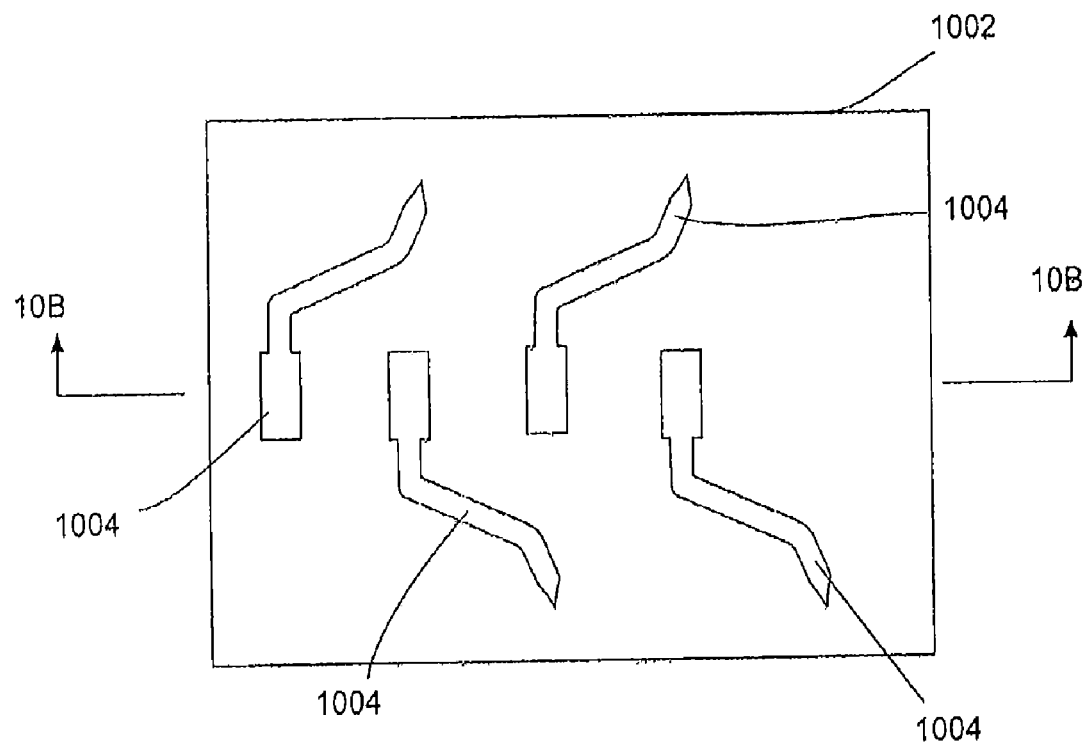
FIG. 10 illustrates an alternative EDM electrode that may be used to manufacture probes of a probe array.
Figure 11:
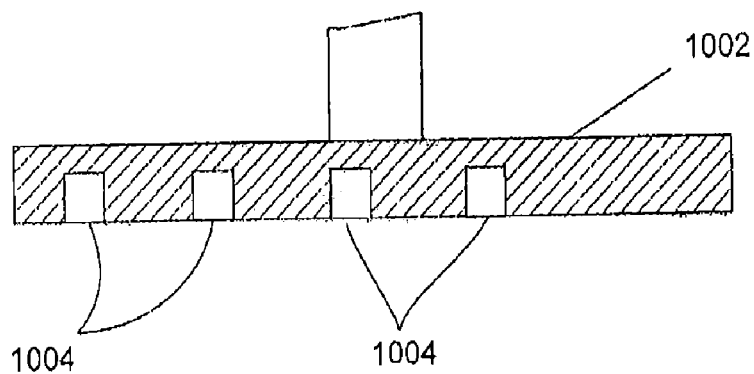
FIG. 11 illustrates a cross-section of the EDM electrode of FIG. 10.

FIGS. 10 and 11 illustrate another exemplary EDM electrode 1002 that may be used to manufacture probes for a probe array. FIG. 10 shows a bottom view of the electrode 1002, and FIG. 11 shows a cross-sectional side view of the electrode 1002. As shown, there is a plurality of cavities 1004 in the bottom of the electrode 1002. As will be seen, the cavities 1004 are in the shape of probes to be made.

Figure 12:
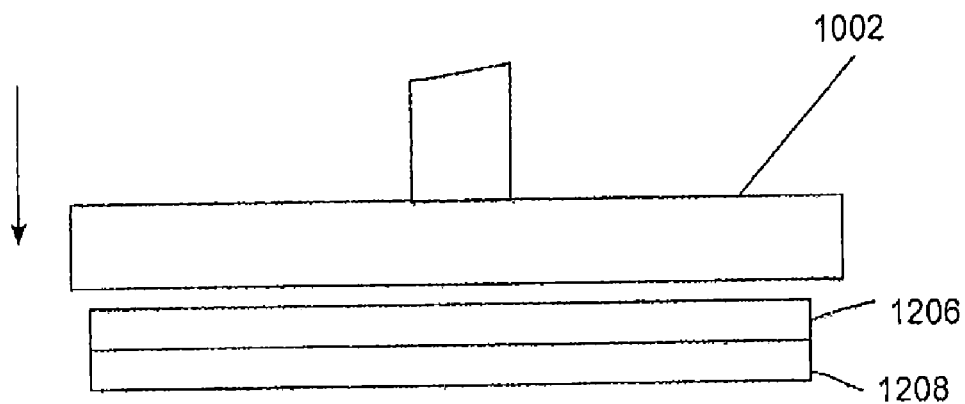
FIGS. 12-16 illustrate an alternative process of making the probes.
Figure 13:
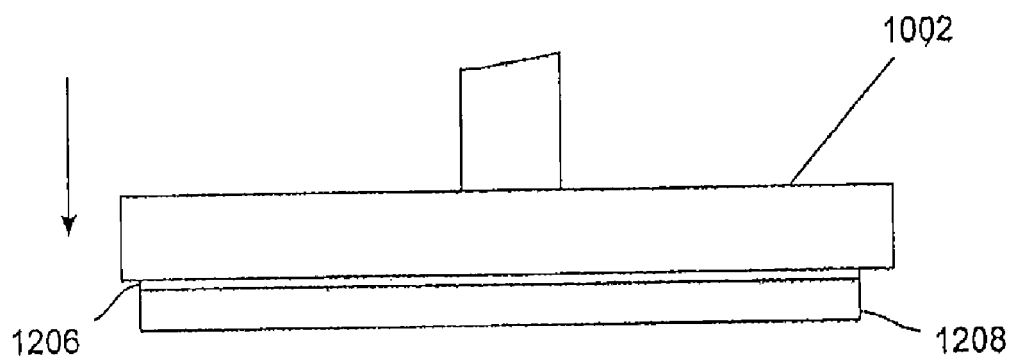
Figure 14:
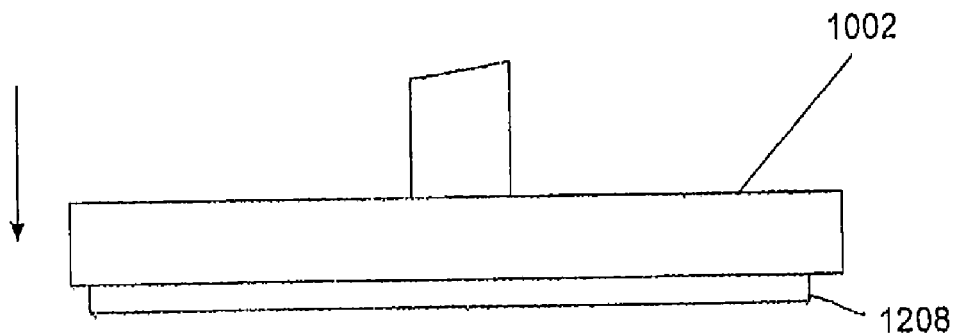

As shown in FIGS. 12-14 (in which the electrode 1002 is shown in cross-section), the electrode 1002 is brought into contact with probe material 1206, which may be similar to probe material 102 discussed above. As shown in FIG. 12, the probe material 1206 may optionally be adhered to a sacrificial material 1208. As shown in FIG. 13, the electrode 1002 shapes the probe material 1206. As shown in FIG. 14, the electrode 1002 may also partially shape the sacrificial material 1208.

Figure 15:
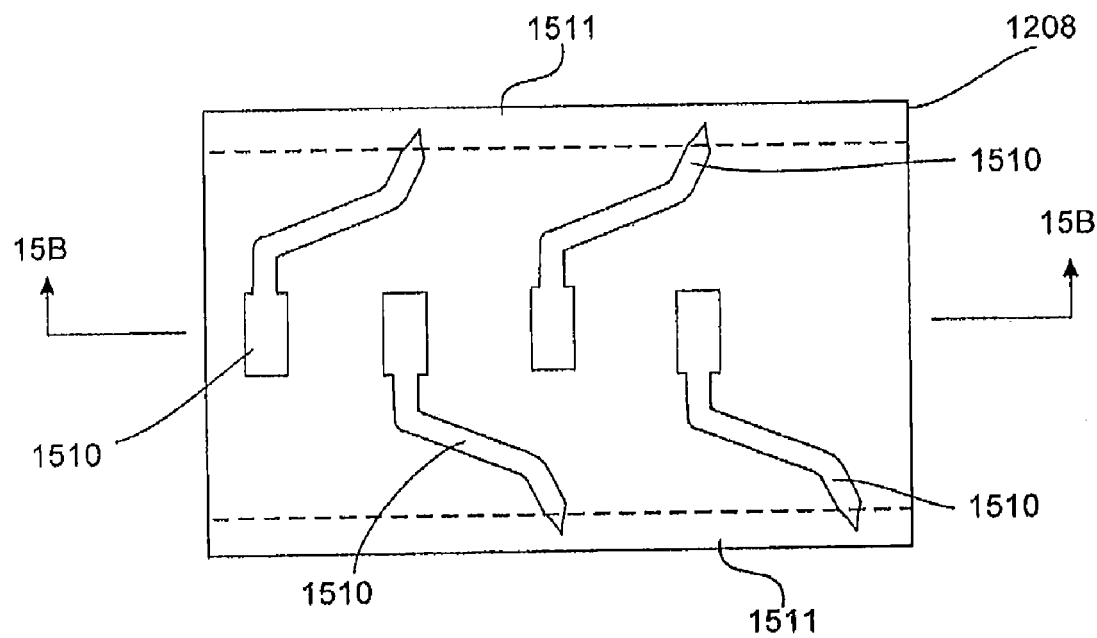
Figure 16:
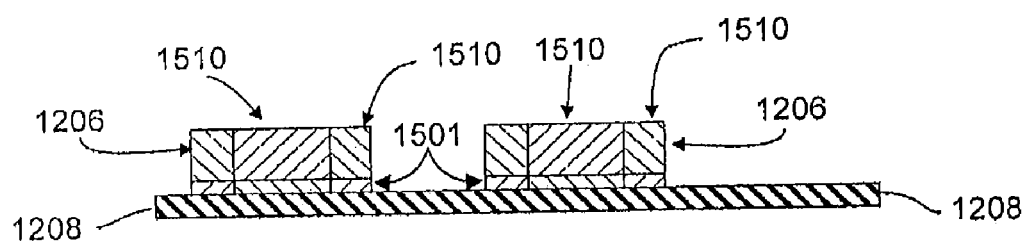
Figure 17:
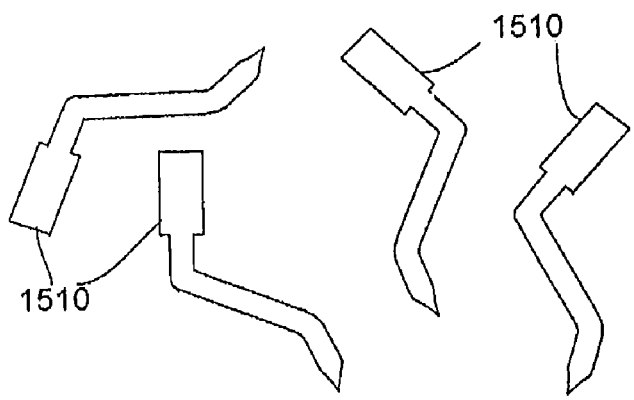
FIG. 17 shows loose probes formed according to the process shown in FIGS. 12-16.

FIGS. 15 and 16 show a top view and cross-sectional side view, respectively, of the probe material 1206 and sacrificial material 1208 after they have been shaped by the electrode 1002 (as shown in FIGS. 12-14). As shown, the electrode 1002 shapes the probe material 1206 and a first layer of sacrificial material 1501 (i.e., an upper layer of original sacrificial material 1208) as defined by the cavities 1004 in the electrode 1002. The probe material 1206 is then released from the sacrificial material 1208 and 1501, leaving loose probes 1510 made of the probe material 1206, as shown in FIG. 17. Alternatively, the EDM electrode may be fashioned to leave small amounts of material (not shown) between the probes 1510, tying the probes together. This may allow the probes to be further processed or handled in groups. It may also aid in handling the probes during later assembly. Preferably, such tying material is left in sufficiently thin quantities that it is easily removed (e.g., broken) from the probes.

As mentioned above, the sacrificial material 1208 is not necessary. The probe material 1206 could be provided by itself, and the electrode 1002 could simply etch through probe material 1206. Moreover, if used, the sacrificial material 1208 need not be shaped by the electrode 1002. That is, the electrode 1002 may be stopped in FIG. 14 just as it reaches the sacrificial material 1208 so that it etches only the probe material 1206.

Regardless of whether or not the sacrificial material 1208 is etched, how the sacrificial material 1208 is adhered to and then released from the probe material 1206 is not critical to the invention. Likewise, the material used as the sacrificial material 1208 is not critical to the invention. For example, the probe material 1206 and the sacrificial material 1208 may be adhered together using any suitable adhesive (e.g., epoxy, etc.). The probe material 1206 and the sacrificial material 1208 may then be separated by dissolving, etching away, or otherwise removing the adhesive. As another example, the sacrificial material 1208 may be dissolved or etched away to separate the probes 1510 from the sacrificial material.

As an alternative, the initial block of probe material 1206 may be a composite material that includes one material for the bodies of probes 1510 and a different material for the tips of probes 1510. For example, the initial block of material from which the result shown in FIG. 15 was processed may include a rectangular swath of tip material across the top and across the bottom of the larger rectangular structure shown in FIG. 15. (Exemplary swaths are shown in FIG. 15 in dashed lines and labeled 1511.) Such swaths would be large enough to include the tips of probes 1510 shown in FIG. 15. In this way, the probes 1510 may comprise multiple materials (e.g., one material for the body of the probes, and a (different material for the tips of the probes). Alternatively, the entire block is made of the same material but the swaths 1511 are specially treated, such as discussed above with respect to the probe or tip materials shown in FIG. 1.

Figure 18:
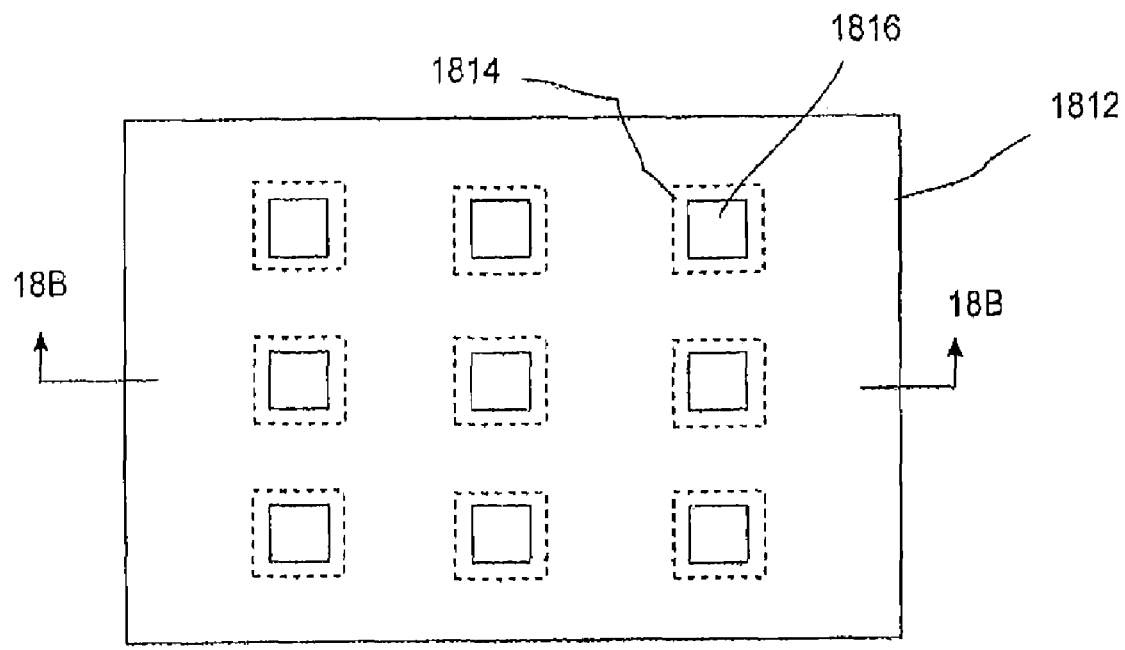
FIG. 18 illustrates a base substrate for mounting the probes.
Figure 19:
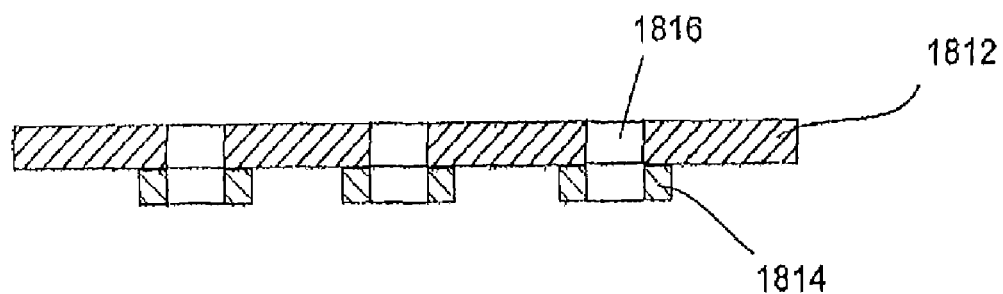
FIG. 19 illustrates a cross-section of the base substrate of FIG. 18.
Figure 20:
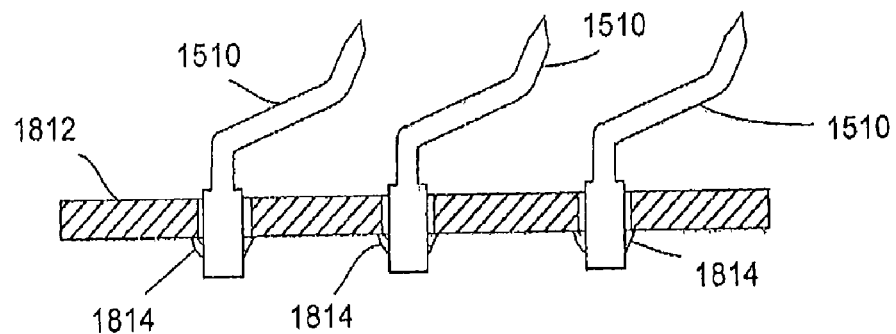
FIGS. 20-21 illustrate assembly of the probes into an array.
Figure 21:
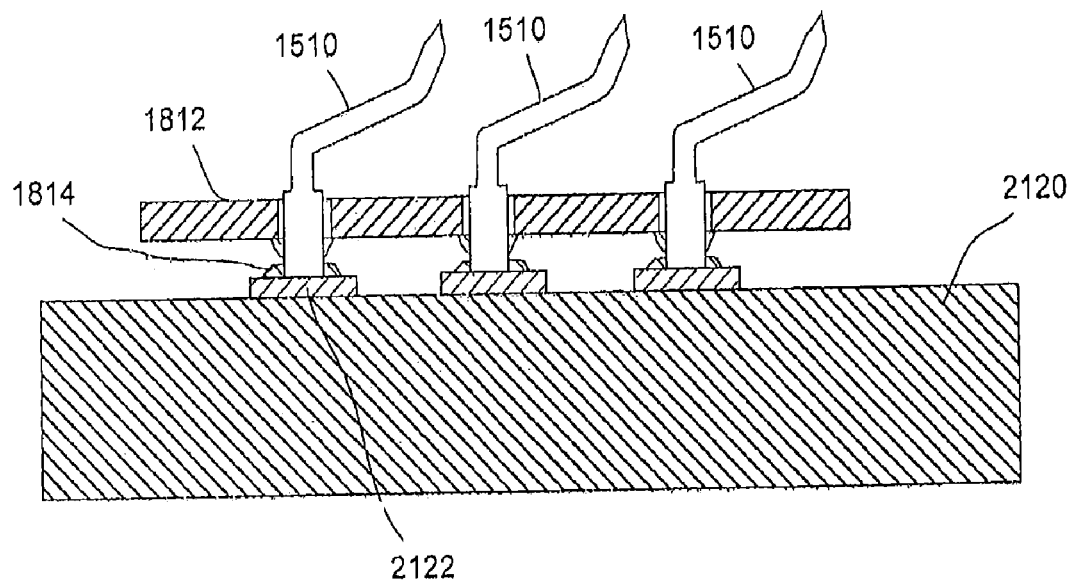

An exemplary use of the loose probes 1510 shown in FIG. 17 is illustrated in FIGS. 18-21. Illustrated in FIGS. 18 and 19 is a base substrate 1812 with openings 1816 and solder 1814 around the openings 1816. As shown in FIG. 20, probes 1510 may be inserted into the openings 1816, and the solder 1814 flowed to secure the probes 1510 in the openings 1816. As shown in FIG. 21, one or more such base substrates 1812 may in turn be secured (e.g., by solder 1814, brazing, welding, or other means) to a larger substrate, such as an electronic component 2120 with conductive terminals 2122. As an example, the electronic component 2120 may be a space transformer for a probe card assembly, such as the probe card assemblies disclosed in U.S. Pat. No. 5,974,662, issued Nov. 2, 1999, which is incorporated herein by reference. The foregoing exemplary method of assembling loose probes into arrays of probes is described in more detail in commonly assigned U.S. patent application Ser. No. 10/202,712, filed Jul. 24, 2002, which is also incorporated herein by reference.

Like the EDM electrode 201, the EDM electrode 1002 may be formed of any conductive material. Also, the cavities 1004 may be patterned in the electrode 1002 using any suitable method. For example, the cavities 1004 may be etched, machined, etc. into the electrode 1002. As another example, the cavities 1004 may be formed using laser ablation. As yet another example, the sacrificial substrate 1208 (e.g., a silicon wafer) may be covered with a photo resist, and the photo resist patterned, developed, and removed, such that photo resist remains on the sacrificial substrate 1208 only where cavities 1004 are to be formed. The sacrificial substrate 1208 is then metalized (e.g., by plating, deposition, etc.), forming a bottom plate of the electrode around the patterned photo resist, which is then removed, leaving cavities 1004 in the newly formed bottom plate.

Advantages of the method of making the probe array according to the present invention include independent processing of two different substrates. Therefore, the processing steps of the two stages can be carried out in parallel and independent of one another. Any errors or defects that may be present require only a repetition of one set of steps. Also, the resultant probe array has through holes that provide support along at least a segment of the probe. The support is especially advantageous in a probe array with lateral contact movement or wiping (i.e., movement of the probes first laterally along the surface of the device under test, and then "bumping" over a terminal pad on the device under test).

It will be understood by those skilled in the art that various changes in form and details may be made therein without departing from the spirit and scope of the invention as defined in the appended claims. Thus, the breadth and scope of the present invention should not be limited by any of the above-described exemplary embodiments, but should be defined only in accordance with the following claims and their equivalents.

What is claimed is:

1. A method of manufacturing comprising:
   removing with an electric discharge machine (EDM) material from a block of material to form shaped contact tips at first ends of probes, said shaped tips configured to contact and thereby make electrical connections with terminals of an electronic device wherein:
   said block of material comprises a layer of tip material and a layer of probe material;
   said removing comprises removing material from said tip material to form said shaped contact tips; and
   said tip material comprises at least one of palladium, gold, rhodium, nickel, cobalt, an alloy of palladium, an alloy of gold, an alloy of rhodium, an alloy of nickel, and an alloy of cobalt.

2. A method of manufacturing comprising:
   removing with an electric discharge machine (EDM) material from a block of material to form shaped contact tips at first ends of probes, said shaped tips configured to contact and thereby make electrical connections with terminals of an electronic device; and
   cutting with an EDM said probes out of said block of material.

3. The method of claim 2, wherein said cutting is in a direction from said first ends of said probes to second opposite ends of said probes.

4. The method of claim 2, wherein said cutting is in a direction from a first side profile of each of said probes to a second opposite side profile of each of said probes.

5. The method of claim 4, wherein said first side profiles include said first ends of said probes and second opposite ends of said probes.

6. The method of claim 5, wherein each of said first side profiles comprises a base, a body with least one change in direction, and one of said contact tips.

7. The method of claim 2, wherein after said cutting, said probes are loose probes.

8. A method of manufacturing comprising:
   removing with an electric discharge machine (EDM) material from a block of material to form shaped contact tips at first ends of probes, said shaped tips configured to contact and thereby make electrical connections with terminals of an electronic device; and
   attaching ones of said probes to a substrate.

9. The method of claim 8, further comprising forming electrical connections on said substrate to said ones of said probes for connecting to external signal sources.

10. A method of manufacturing a plurality of probes, said method comprising:
    removing first material from a block with an electric discharge machine comprising an electrode having a plurality of cavities therein, said cavities comprising shapes that correspond to desired shapes of said probes,
    said removing leaving second material of said block corresponding to the cavities to form said plurality of probes; and
    removing with and EDM a portion of said second material to form shaped contact tips at ends of said probes, wherein said second material comprises a plurality of layers of materials, and said removing a portion of said second material to form shaped contact tips at ends of said probes comprises removing a portion of one of said layers.

11. A method of manufacturing a plurality of probes, said method comprising:
    removing first material from a block with an electric discharge machine comprising an electrode having a plurality of cavities therein, said cavities comprising shapes that correspond to desired shapes of said probes,
    said removing leaving second material of said block corresponding to the cavities to form said plurality of probes,
    wherein after said removing, said probes are loose probes.

12. A method of manufacturing a plurality of probes, said method comprising:
    removing first material from a block with an electric discharge machine comprising an electrode having a plurality of cavities therein, said cavities comprising shapes that correspond to desired shapes of said probes,
    said removing leaving second material of said block corresponding to the cavities to form said plurality of probes; and
    attaching ones of said probes to a substrate.

13. The method of claim 12, further comprising forming electrical connections on said substrate to said ones of said probes for connecting to external signal sources.

* * * * *